(12) United States Patent
Chen et al.

(10) Patent No.: US 12,079,496 B2
(45) Date of Patent: Sep. 3, 2024

(54) BUNDLE MULTIPLE TIMING PARAMETERS FOR FAST SLC PROGRAMMING

(71) Applicant: SanDisk Technologies LLC, Addison, TX (US)

(72) Inventors: Chin-Yi Chen, Sunnyvale, CA (US); Muhammad Masuduzzaman, Milpitas, CA (US); Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 182 days.

(21) Appl. No.: 17/901,310

(22) Filed: Sep. 1, 2022

(65) Prior Publication Data
US 2024/0078028 A1 Mar. 7, 2024

(51) Int. Cl.
*G06F 3/06* (2006.01)

(52) U.S. Cl.
CPC .......... *G06F 3/0632* (2013.01); *G06F 3/0604* (2013.01); *G06F 3/0679* (2013.01)

(58) Field of Classification Search
CPC .... G06F 3/0632; G06F 3/0604; G06F 3/0679; G06F 12/0246; G06F 2212/7211; G11C 16/3459; G11C 16/10; G11C 16/16; G11C 16/30; G11C 16/349
See application file for complete search history.

(56) References Cited

U.S. PATENT DOCUMENTS

| | | | |
|---|---|---|---|
| 9,508,440 B2 | 11/2016 | Aritome | |
| 9,715,939 B2 | 7/2017 | Ellis et al. | |
| 10,430,328 B2 | 10/2019 | Sela et al. | |
| 10,503,431 B2 | 12/2019 | Gorobets et al. | |
| 10,559,370 B2 | 2/2020 | Yang et al. | |
| 10,698,610 B2 | 6/2020 | Yang | |
| 11,004,523 B2 | 5/2021 | Suzuki et al. | |
| 11,164,634 B2 | 11/2021 | Yang et al. | |
| 11,188,244 B2 | 11/2021 | Sato | |
| 2017/0047124 A1* | 2/2017 | Ellis | G06F 3/0637 |
| 2019/0034330 A1* | 1/2019 | Natarajan | G11C 29/021 |
| 2020/0401345 A1* | 12/2020 | Park | G06F 12/0246 |
| 2020/0402582 A1* | 12/2020 | Yang | G06F 3/0679 |
| 2021/0264980 A1 | 8/2021 | Sagron et al. | |

* cited by examiner

*Primary Examiner* — Tracy C Chan
(74) *Attorney, Agent, or Firm* — Vierra Magen Marcus LLP

(57) ABSTRACT

Technology is disclosed herein for managing timing parameters when programming memory cells. Timing parameters used sub-clocks in an MLC program mode may also be used for those same sub-clocks in a first SLC program mode. However, in a second SLC program mode a different set of timing parameters may be used for that set of sub-clocks. Using the same set of timing parameters for the MLC program mode and the first SLC program mode saves storage space. However, the timing parameters for the MLC program mode may be slower than desired for SLC programming. A different set of timing parameters may be used for the second SLC program mode to provide for faster program operation. Moreover, the different set of timing parameters used for the faster SLC program mode do not require storage of a separate set of timing parameters.

20 Claims, 16 Drawing Sheets

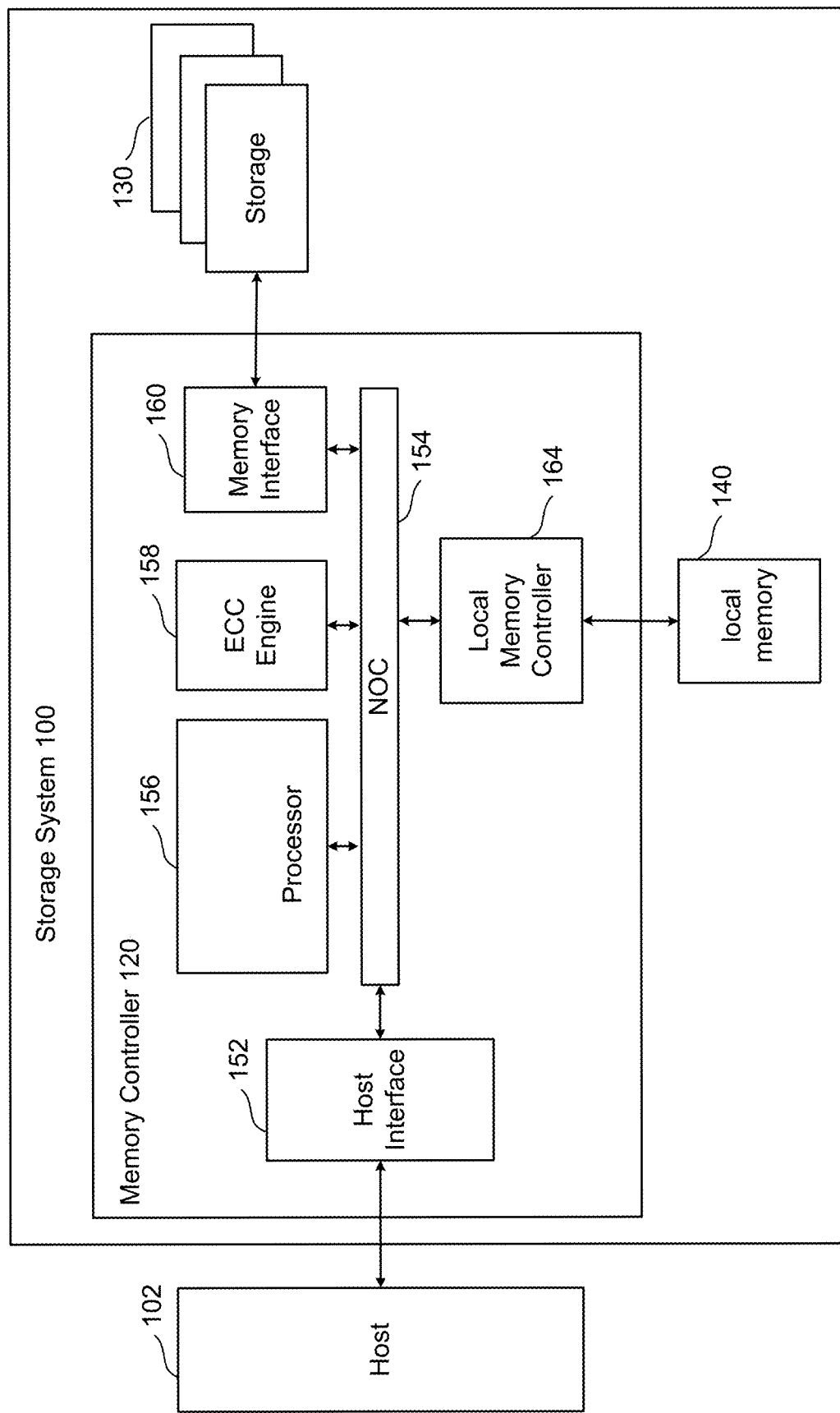

| Sub-clock_A timing parameters | | | |
|---|---|---|---|
| DAC | | | Time Duration |
| 0 | 0 | 0 | TD1a |
| 0 | 0 | 1 | TD2a |
| 0 | 1 | 0 | TD3a |
| 0 | 1 | 1 | TD4a |
| 1 | 0 | 0 | TD5a |
| 1 | 0 | 1 | TD6a |
| 1 | 1 | 0 | TD7a |
| 1 | 1 | 1 | TD8a |

| Sub-clock_B timing parameters | | | |
|---|---|---|---|
| DAC | | | Time Duration |
| 0 | 0 | 0 | TD1b |
| 0 | 0 | 1 | TD2b |
| 0 | 1 | 0 | TD3b |
| 0 | 1 | 1 | TD4b |
| 1 | 0 | 0 | TD5b |
| 1 | 0 | 1 | TD6b |
| 1 | 1 | 0 | TD7b |
| 1 | 1 | 1 | TD8b |

| Sub-clock_C timing parameters | | | | |
|---|---|---|---|---|
| DAC | | | | Time Duration |
| 0 | 0 | 0 | 0 | TD1c |
| 0 | 0 | 0 | 1 | TD2c |
| 0 | 0 | 1 | 0 | TD3c |
| 0 | 0 | 1 | 1 | TD4c |
| 0 | 1 | 0 | 0 | TD5c |
| 0 | 1 | 0 | 1 | TD6c |
| 0 | 1 | 1 | 0 | TD7c |
| 0 | 1 | 1 | 1 | TD8c |
| 1 | 0 | 0 | 0 | TD9c |
| 1 | 0 | 0 | 1 | TD10c |
| 1 | 0 | 1 | 0 | TD11c |
| 1 | 0 | 1 | 1 | TD12c |
| 1 | 1 | 0 | 0 | TD13c |
| 1 | 1 | 0 | 1 | TD14c |
| 1 | 1 | 1 | 0 | TD15c |
| 1 | 1 | 1 | 1 | TD16c |

| Sub-clock_D timing parameters | | | | |
|---|---|---|---|---|
| DAC | | | | Time Duration |
| 0 | 0 | 0 | 0 | TD1d |
| 0 | 0 | 0 | 1 | TD2d |
| 0 | 0 | 1 | 0 | TD3d |
| 0 | 0 | 1 | 1 | TD4d |
| 0 | 1 | 0 | 0 | TD5d |
| 0 | 1 | 0 | 1 | TD6d |
| 0 | 1 | 1 | 0 | TD7d |
| 0 | 1 | 1 | 1 | TD8d |
| 1 | 0 | 0 | 0 | TD9d |
| 1 | 0 | 0 | 1 | TD10d |
| 1 | 0 | 1 | 0 | TD11d |
| 1 | 0 | 1 | 1 | TD12d |
| 1 | 1 | 0 | 0 | TD13d |
| 1 | 1 | 0 | 1 | TD14d |
| 1 | 1 | 1 | 0 | TD15d |
| 1 | 1 | 1 | 1 | TD16d |

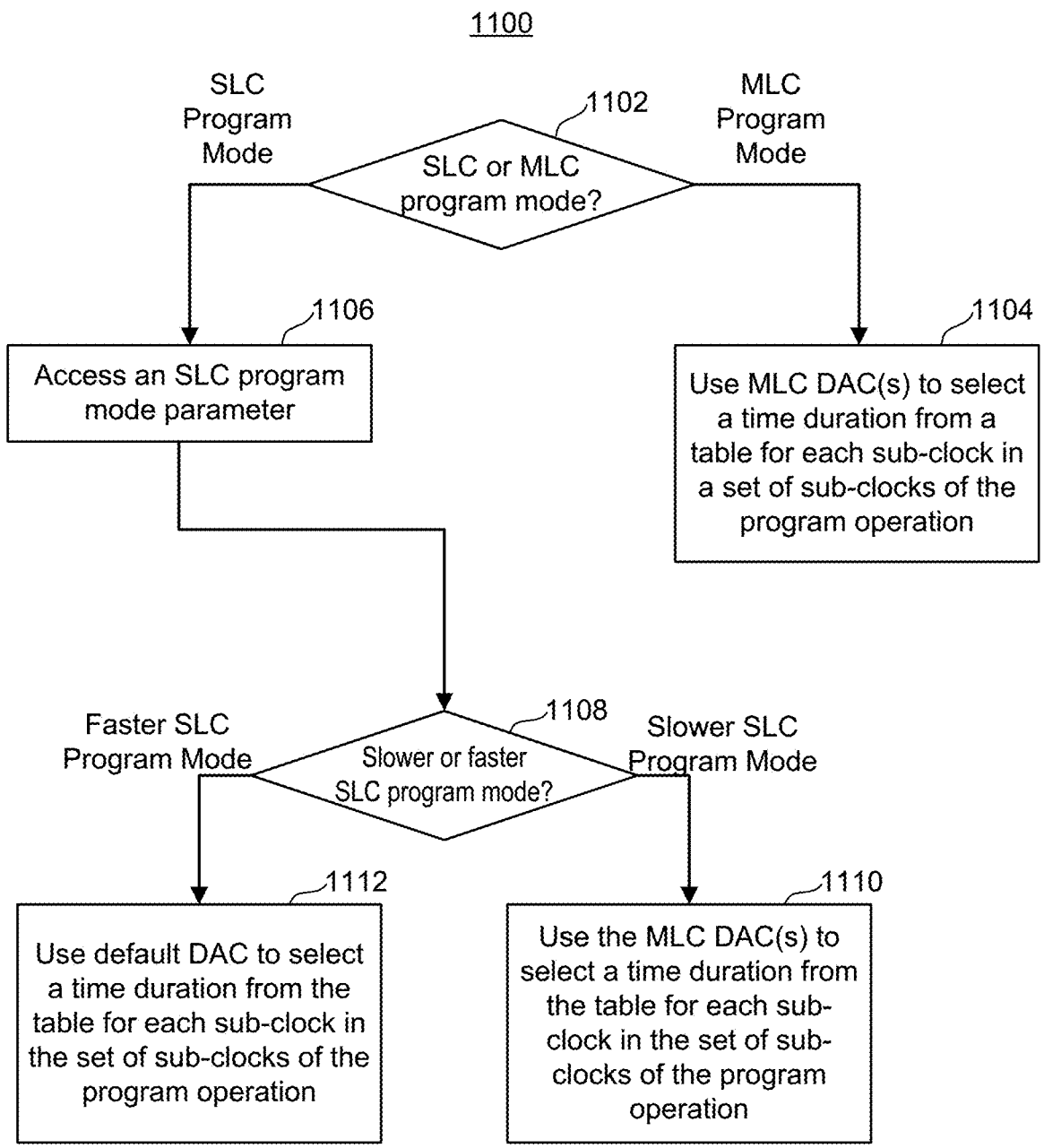

BUNDLE MULTIPLE TIMING PARAMETERS FOR FAST SLC PROGRAMMING

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block. In some architectures such as NAND, each memory cell is connected to a word line and will typically have a first neighbor memory cell connected to a first neighbor word line and a second neighbor memory cell connected to a second neighbor word line. However, a memory cell at the edge of a block (e.g., near the end of the NAND string) will only have one neighbor memory cell that is used to store data.

The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of program voltage pulses are applied to the control gates of the memory cells. Each voltage pulse may be stepped up in magnitude from a previous program pulse by a step size in a processed referred to as incremental step pulse programming. Each program voltage may be followed by a verify operation to determine if the respective memory cells have been programmed to the desired memory state. Thus, the program operation may include a number of program/verify loops. The word line that is connected to the memory cells being verified is referred to herein as the "selected word line." The remaining word lines connected to other memory cells on the NAND strings are referred to herein as "unselected word lines."

A program operation will also involve raising and/or lowering of voltage to unselected word line, bit lines, control lines, etc. To help manage the timing of the application of such voltages, the program operation can be divided into a number of segments that are referred to herein as sub-clocks.

BRIEF DESCRIPTION OF THE DRAWINGS

Like-numbered elements refer to common components in the different figures.

FIG. 1 is a block diagram depicting one embodiment of a storage system.

FIGS. 10A, 10B, 10C, and 10D are example tables of timing parameters for four different sub-clocks.

FIG. 11 is a flowchart of one embodiment of a process of programming memory cells in which timing parameters for MLC programming may be shared with SLC programming, while allowing for a special faster SLC program mode.

DETAILED DESCRIPTION

Figure 2A:
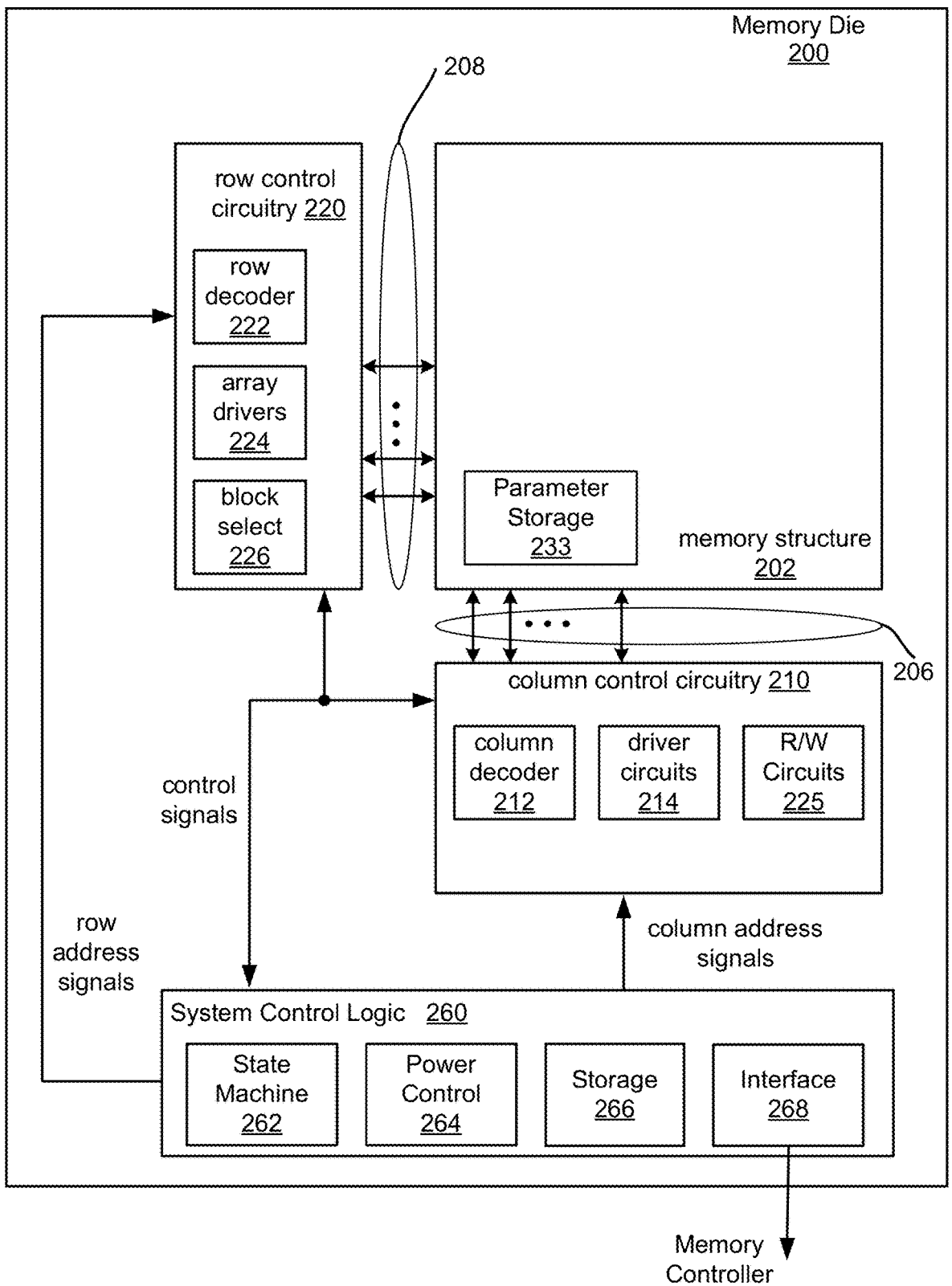
FIG. 2A is a block diagram of one embodiment of a memory die.

Technology is disclosed herein for managing timing parameters when programming non-volatile memory cells. In an embodiment, timing parameters that are used for a set of sub-clocks in an MLC program mode are also used for those same set of sub-clocks in a first SLC program mode. However, in a second SLC program mode a different set of timing parameters are used for that set of sub-clocks. Using the same set of timing parameters for the MLC program mode and the first SLC program mode helps to reduce storage space that is used to store the timing parameters. However, the timing parameters for the MLC program mode may be slower than desired in some case for SLC programming. The aforementioned different set of timing parameters that are used for the second SLC program mode provide for a faster program operation in the second SLC program mode. Moreover, the different set of timing parameters that are used for the faster SLC program mode do not require storage of a separate set of timing parameters for the faster SLC mode.

In an embodiment, the faster SLC program mode allows the memory system to take full advantage of the speed of a memory interface between a memory controller and memory dies containing the memory cells. Taking full advantage of the memory interface speed may depend on factors such as how many memory dies are in a memory package connected to the memory controller. For example, a memory package having more memory dies may be better able to take advantage of the speed of the memory interface. Having more dies (or having more planes) allows for more parallelization such that a given program operation can be slower. However, a memory package having fewer memory dies (and planes) may have trouble taking advantage of the speed of the memory interface. In one embodiment, aggressive timing parameters are used for the faster SLC program mode which allows the memory system to take advantage of the speed of the memory interface. However, technical challenges arise in providing these more aggressive timing parameters in a memory system that allows both SLC and MLC program modes. For example, the timing parameters that are used for an MLC program mode may be used for an SLC program mode to save storage space. However, the timing parameters that are used for the MLC program mode may not allow taking advantage of the speed of the memory interface for the SLC program mode.

In one embodiment, the memory system stores a table of timing parameters for each sub-block in a set of sub-clocks of a program operation. In an embodiment, the MLC program mode and both SLC program modes share the same tables for this set of sub-clocks. In an embodiment, the MLC program mode and the slower SLC program mode use the same entries from each table to thereby use the same timing for each sub-block in the set of sub-clocks. However, for the faster SLC program mode the entry specifying the shortest time duration may be selected from each respective table. Therefore, the MLC program mode and both SLC program modes may share a set of trim parameter tables to thereby save storage space. However, when faster SLC programming is desired, different entries in the tables may be used. In one embodiment, those different entries can be specified by a single bit that indicates whether a slower or faster SLC program mode should be used.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202. Such parameters may include timing parameters for program operations as disclosed herein. These parameters are sometimes referred to as "trim parameters." In an embodiment, some of the memory cells in the memory structure 202 are used for parameter storage 233. These parameters may be transferred to storage 266 when the memory die 200 is powered on.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
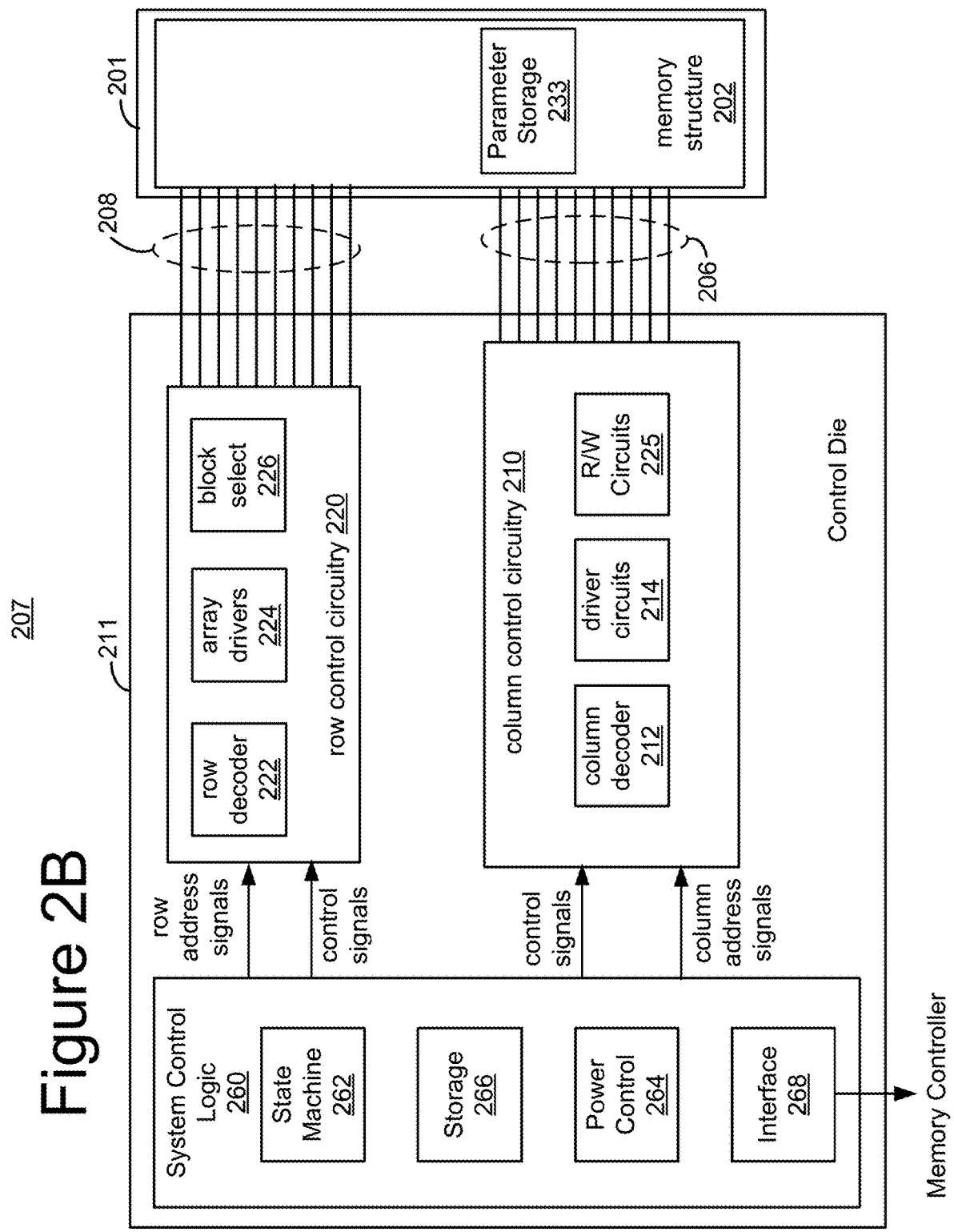
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
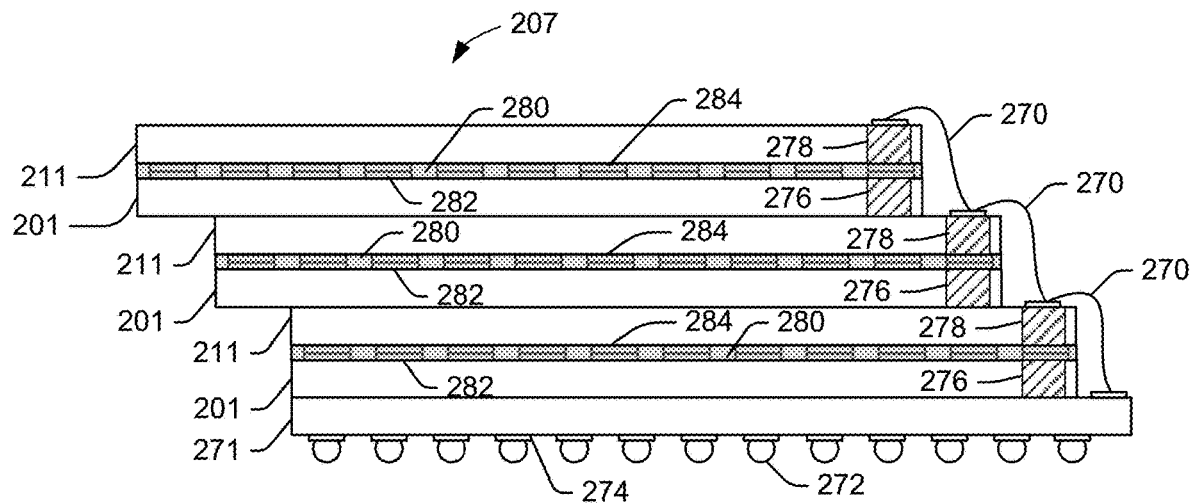
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
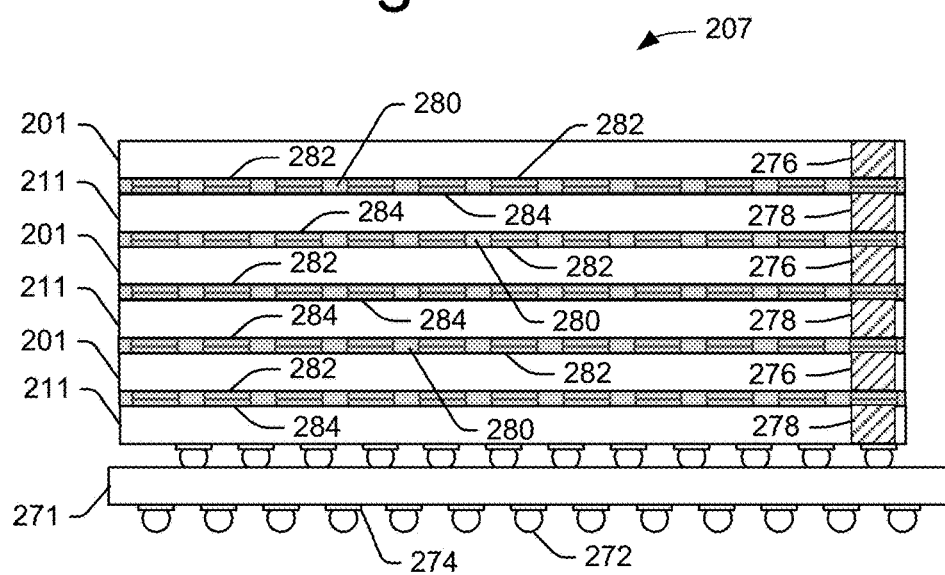

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
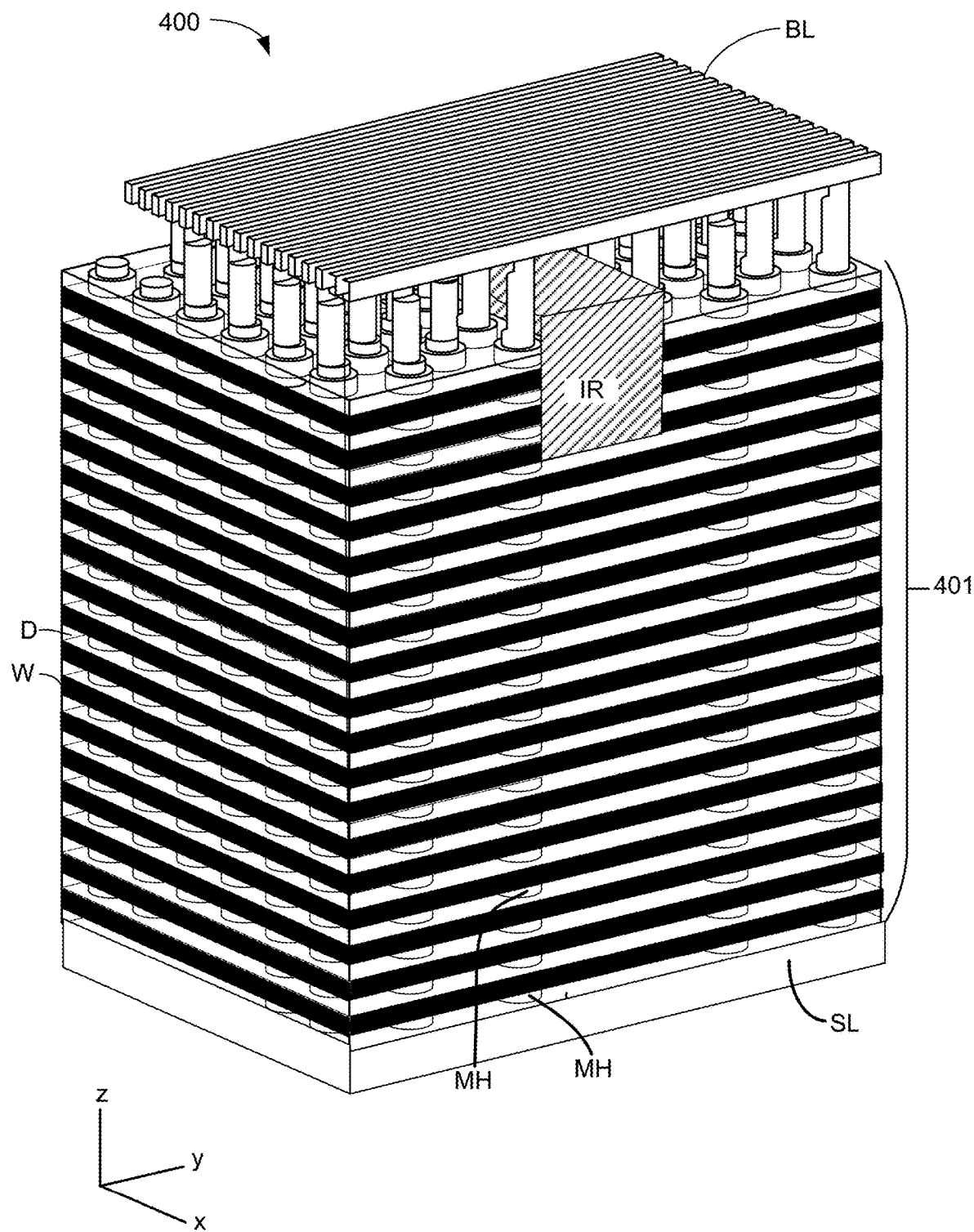
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
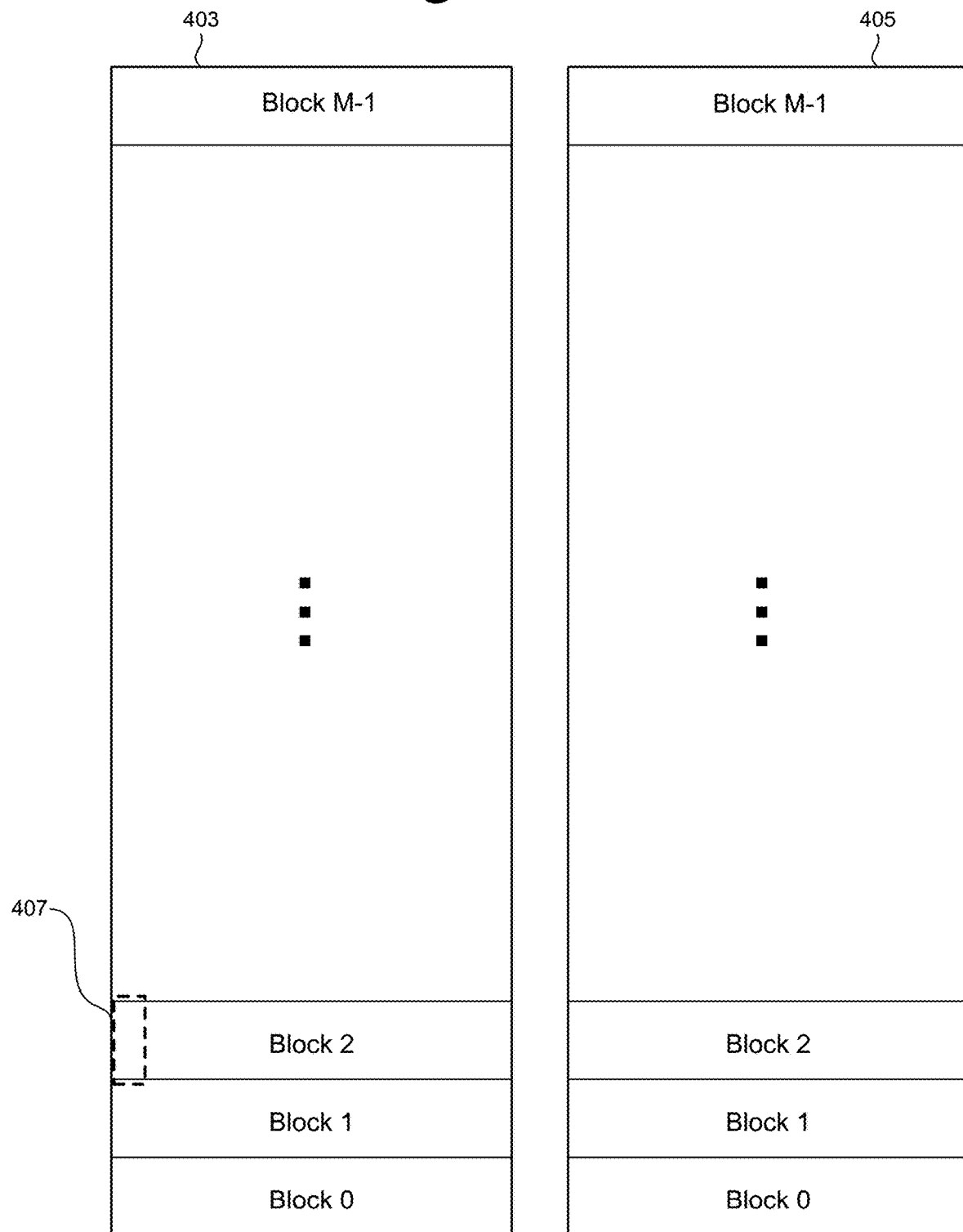
FIG. 4A is a block diagram of one embodiment of a memory structure having two planes.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
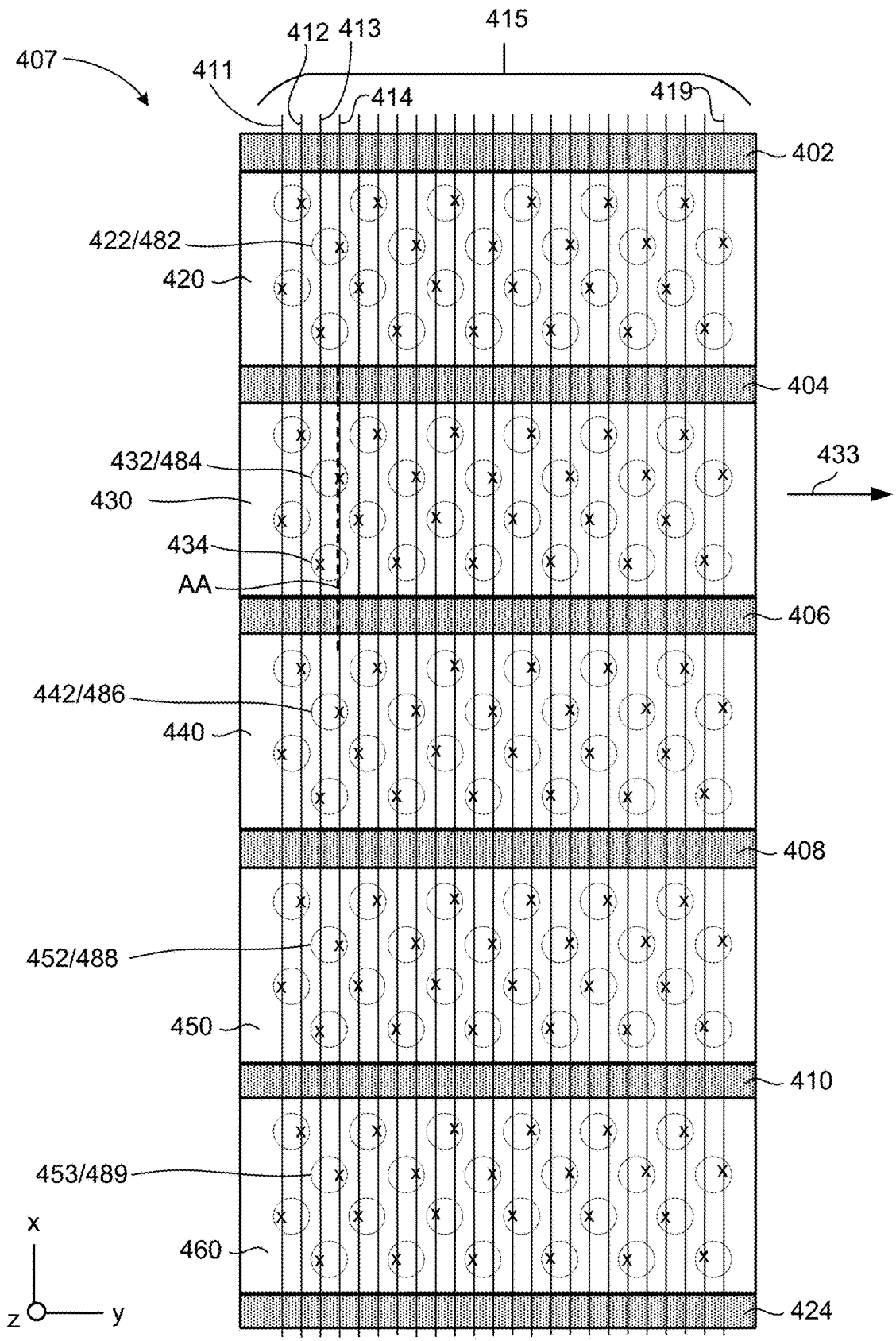
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442. 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, and 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
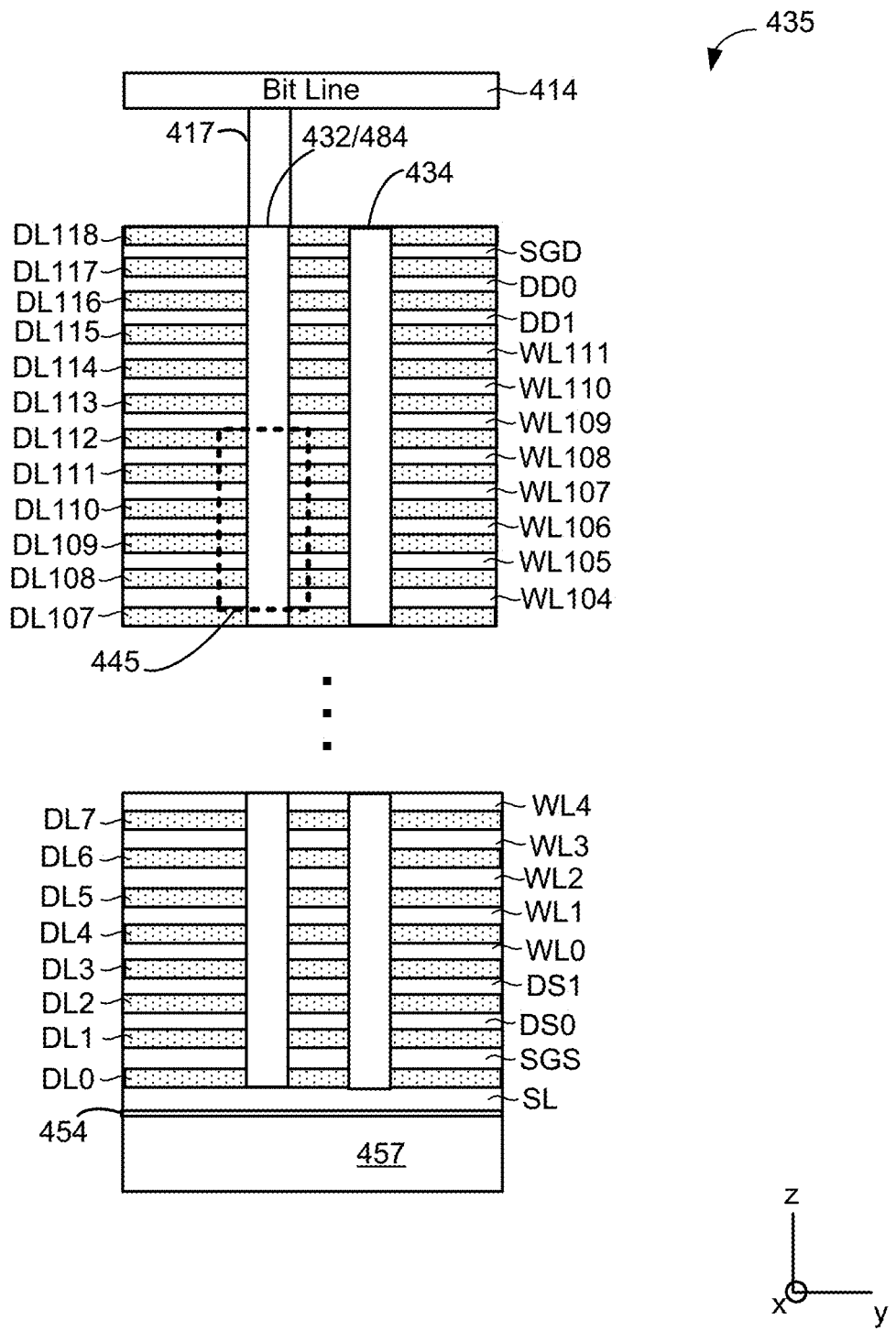
FIG. 4C depicts an embodiment of a stack showing a cross-sectional view along line AA of FIG. 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL111. Each NAND string has a drain side select transistor at the SGD layer. Each NAND string has a source side select transistor at the SGS layer. There may be more than one SGD layer, as well as more than one SGS layer. Also depicted are dielectric layers DL0-DL118.

Columns 432, 434 of memory cells are depicted in the multi-layer stack. The stack includes a substrate 453, an insulating film 454 on the substrate 457, and a portion of a source line SL (or CELSRC). A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
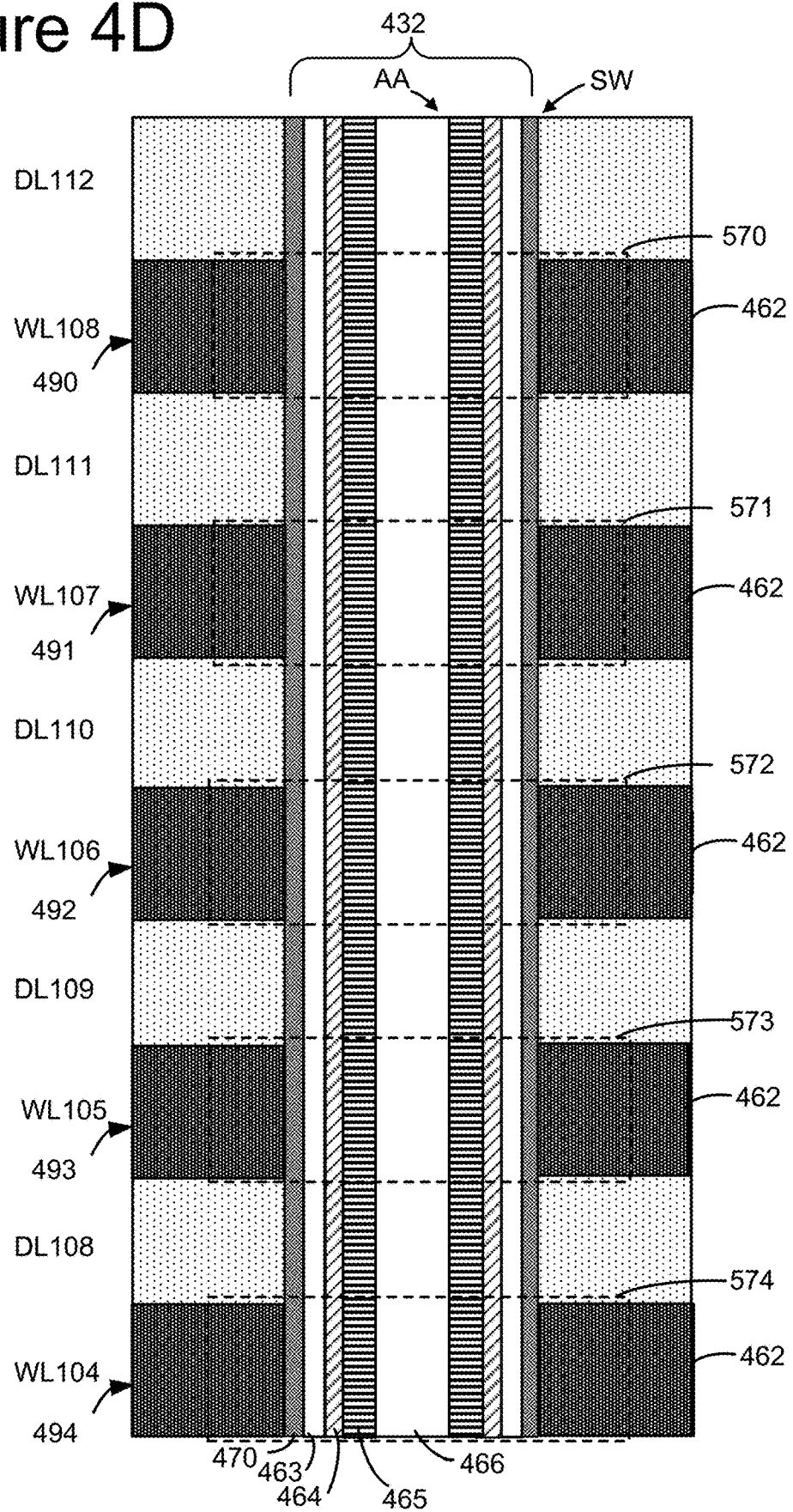
FIG. 4D depicts a view of the region 445 of FIG. 4C.

FIG. 4D depicts a view of the region 445 of FIG. 4C. Data memory cell transistors 570, 571, 572, 573, and 574 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
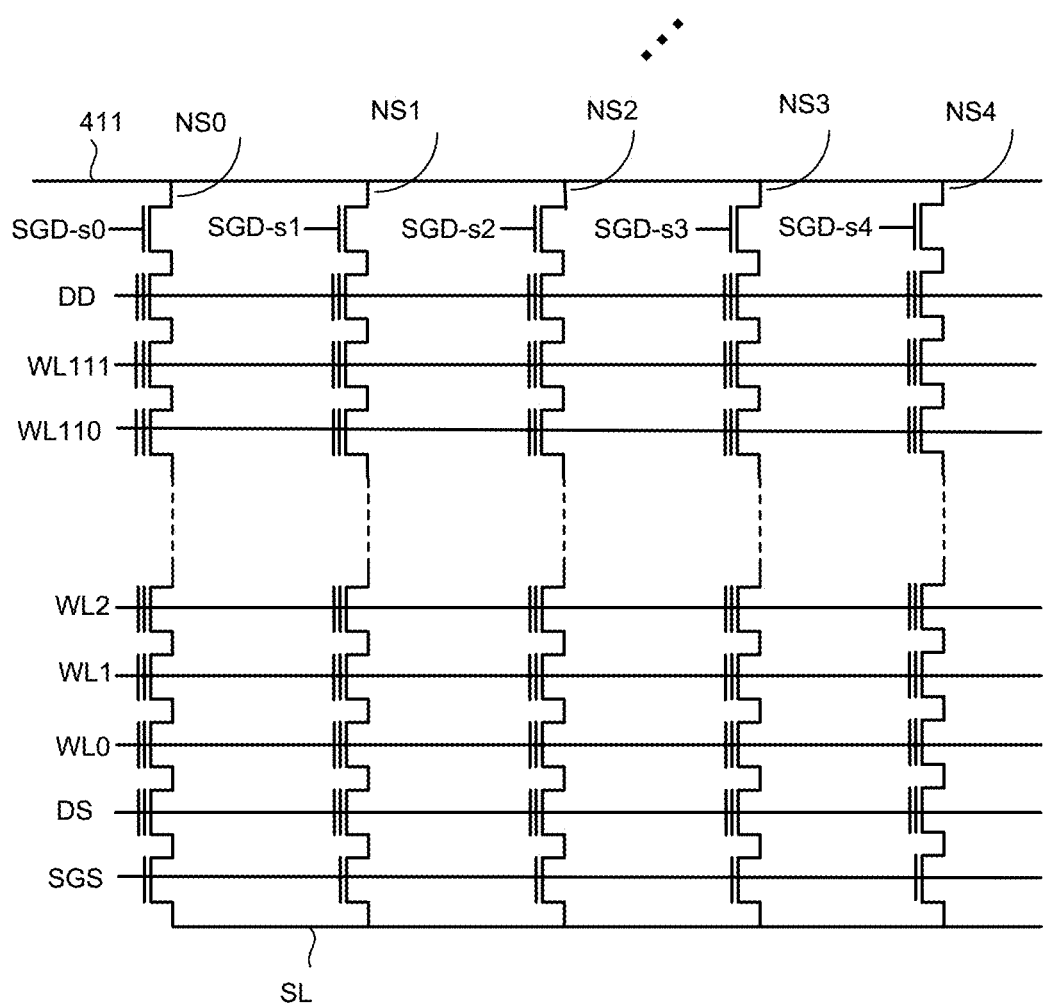
FIG. 4E is a schematic diagram of a portion of one embodiment of a block, depicting several NAND strings.

FIG. 4E is a schematic diagram of a portion of the memory depicted in in FIGS. 4-4D. FIG. 4E shows physical word lines WL0-WL111 running across the entire block. The structure of FIG. 4E corresponds to portion 407 in Block 2 of FIGS. 4A-4B, including bit lines 411, 412, 413, 414, . . . 419. Within the block, each bit line is connected to four NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

Figure 5A:
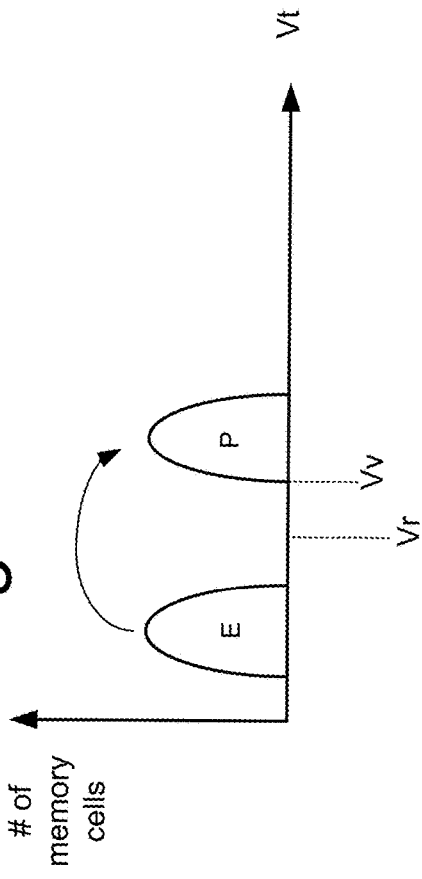
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts a verify reference voltage Vv. In some embodiments, when programming memory cells to data state P, the system will test whether those memory cells have a threshold voltage greater than or equal to Vv. In some embodiments, when programming memory cells to data state P, the system will not perform a verify operation. For example, the memory system may apply a single program pulse without verification.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
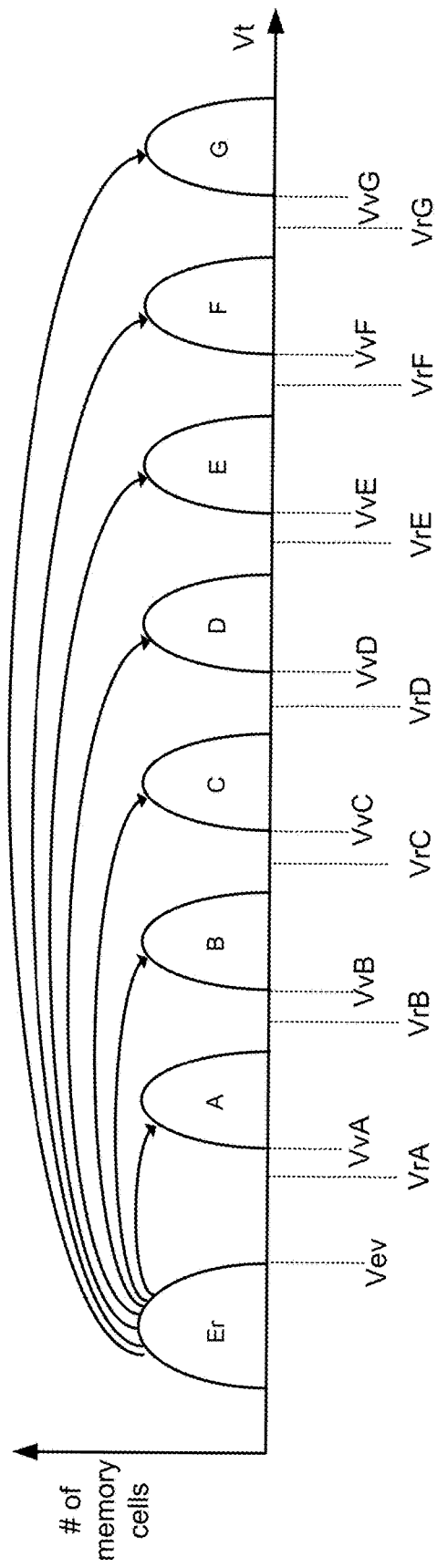

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In one embodiment, the verify reference voltages are VvA, VvB, VvC, VvD, VvE, VvF, and VvG are used when verifying memory cells. For example, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6:
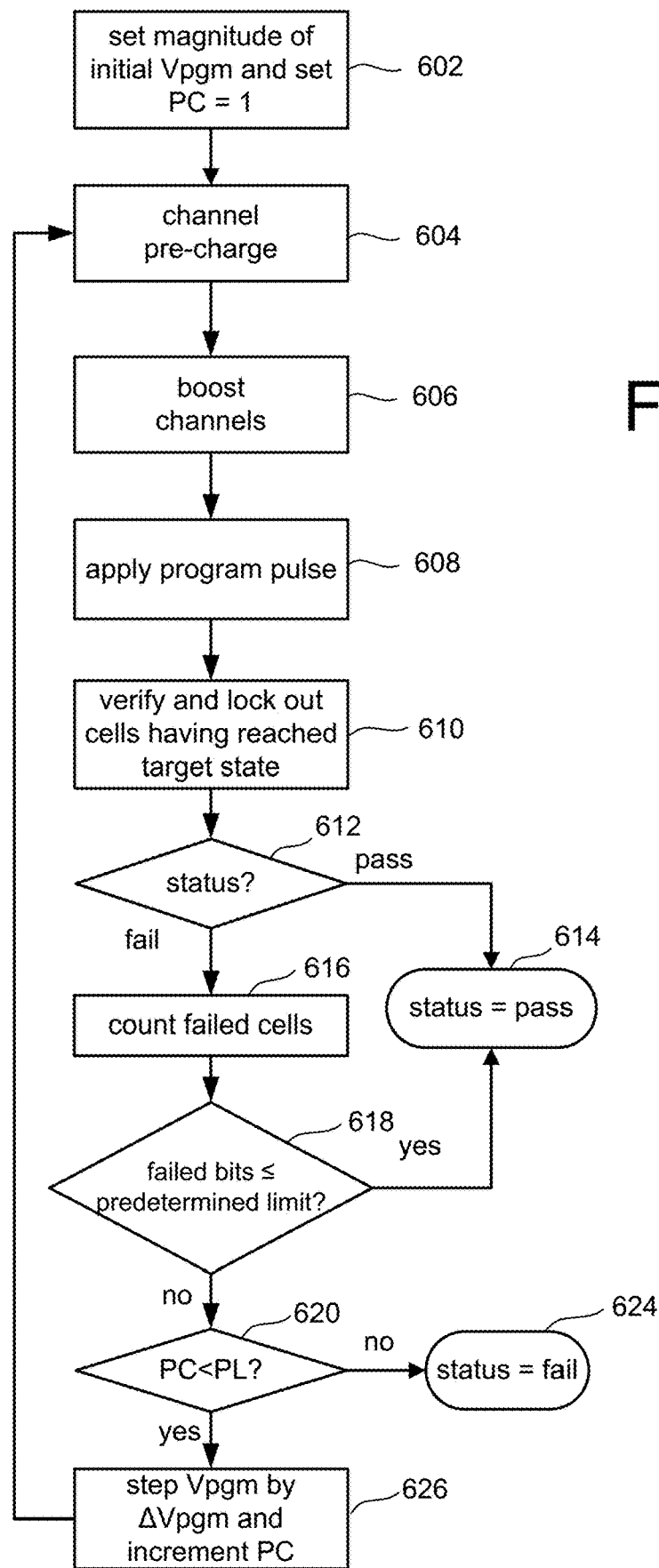
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process. Note that the process of FIG. 6 has multiple program-verify loops. In one embodiment, the memory cells are programmed to the P-state (see FIG. 5A) with a single program pulse without verification.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. However, in some embodiments, the memory cells are not verified. In one embodiment, memory cells are programmed to the P-state (see FIG. 5A) using a single program pulse without verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In some embodiments, the magnitude of the verify reference voltages will depend on whether programming will result in an open block. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B.

Technology is disclosed herein for managing timing parameters when programming non-volatile memory cells. In an embodiment, timing parameters that are used for a set of sub-clocks in an MLC program mode are also used for those same set of sub-clocks in a first SLC program mode. However, in a second SLC program mode a different set of timing parameters are used for that set of sub-clocks. Using the same set of timing parameters for the MLC program mode and the SLC program mode helps to reduce storage space that is used to store the timing parameters. However, the timing parameters for the MLC program mode may be slower than desired in some case for SLC programming. The aforementioned different set of timing parameters that are used for the second SLC program mode provide for a faster program operation in the second SLC program mode. Moreover, the different set of timing parameters that are used for the faster SLC program mode do not require storage of a separate set of timing parameters for the faster SLC mode.

Figure 7:
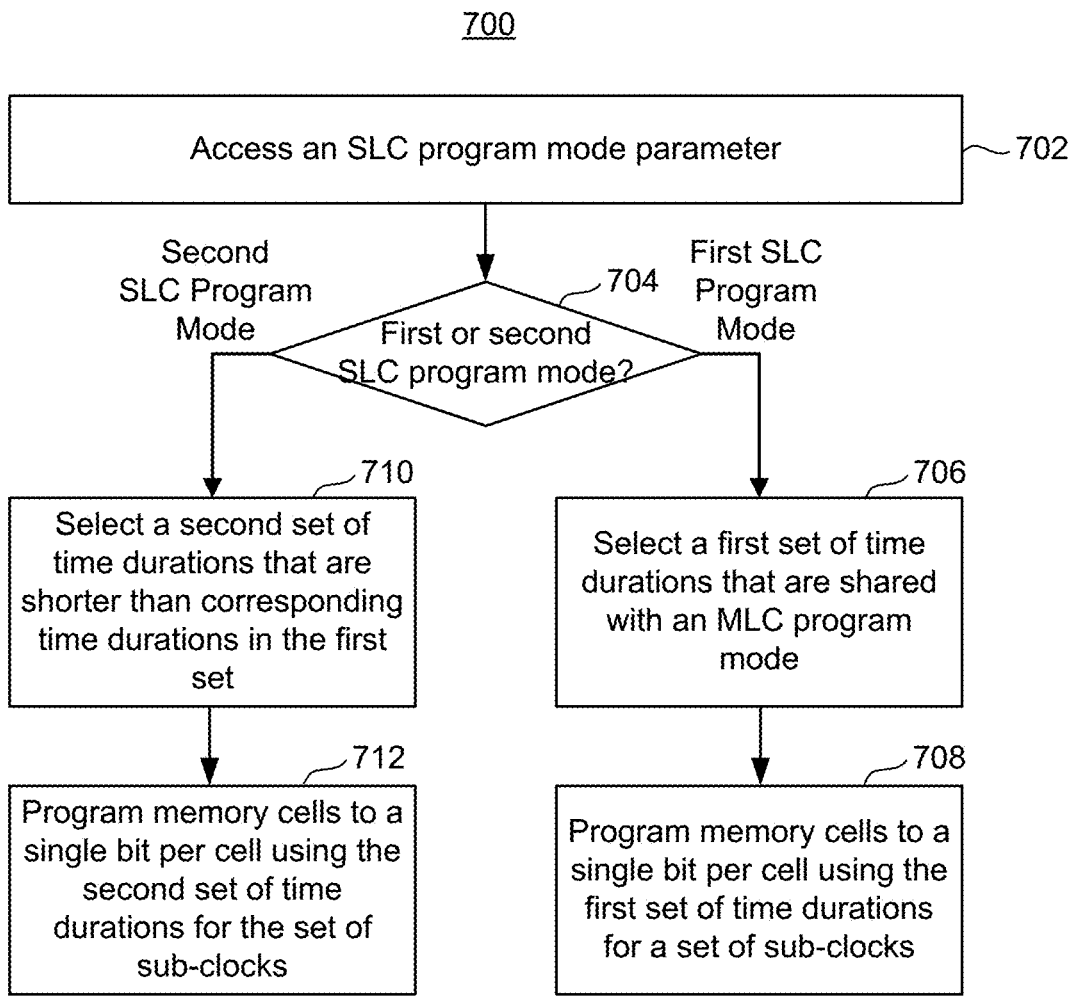
FIG. 7 is a flowchart of one embodiment of a process of SLC programming using different timing parameters in different SLC modes.

FIG. 7 is a flowchart of one embodiment of a process 700 of SLC programming using different timing parameters in different SLC program modes. In an embodiment, there are two SLC program modes having different timing parameters. There may be a slower SLC program mode and a faster SLC program mode.

Step 702 includes accessing an SLC program mode parameter. In an embodiment, the SLC program mode parameter is a single bit that may be accessed from trim parameters. In one embodiment, SLC program mode parameter is stored on the memory die (e.g., memory die 200 or memory structure die 201) at the time of manufacture. For example, the SLC program mode parameter may be stored with other trim parameters in the parameter storage 233 in the memory structure 202. Thus, the SLC program mode parameter could be a factory setting. The SLC program mode parameter may be transferred to the storage 266 when the die is powered on such that it is readily accessible to the state machine 262. In an embodiment, the SLC program mode parameter is provided from the memory controller 120 at runtime, which allows dynamic selection of the SLC program mode. For example, the SLC program mode may be switched between a faster and a slower SLC program mode.

Figure 8:
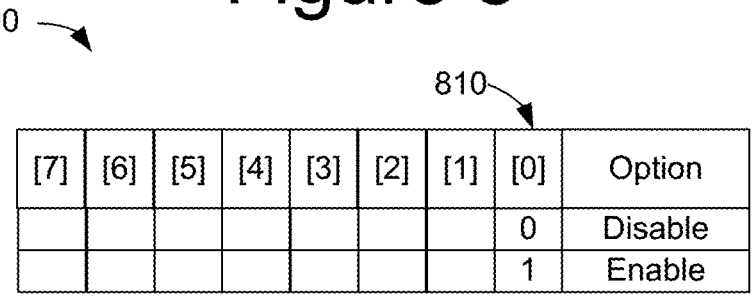
FIG. 8 depicts an example of a portion of trim parameters showing an SLC program parameter.

Referring briefly to FIG. 8, an example of a portion of trim parameters 800 is depicted showing the SLC program mode parameter. In this example, bit[0] of this portion of the trim parameters 800 contains a value for the SLC program mode parameter 810. In this example, a value of 0 is to disable a special SLC program mode, whereas a value of 1 is to enable the special SLC program mode. In one embodiment, when the option is disabled SLC programming shares the same timing parameters with an MLC program mode for a certain set of sub-clocks of the program operation. For example, the time duration of each sub-clock in the set may be the same for this first SLC program mode and the MLC mode. However, when the option is enabled SLC programming may use different timing parameters from the MLC program mode for the set of sub-clocks. In one embodiment, the timing parameters for each sub-clock contain several possible time durations with a faster SLC program mode using a shorter time duration for each sub-clock than the slower SLC program mode (as well as the MLC program mode). In one embodiment, the timing parameters for each sub-clock contain several possible time durations and a faster SLC program mode uses a minimum time duration for each sub-clock in the set when the option is enabled. Therefore, the second SLC program mode may be faster than the first SLC program mode.

Note that the portion of trim parameters 800 that is depicted in FIG. 8 could be stored with other trim parameters when, for example, the memory die is manufactured. As noted above, the trim parameters 800 may be stored in parameter storage 233 and loaded to storage 266 when the memory die is powered on. However, another option is for the memory controller 120 to provide the SLC program mode parameter 810 to the memory die after the die is powered on. Therefore, the SLC program mode may be changed dynamically during runtime.

Returning again to the description of FIG. 7, step 704 includes a determination of whether to perform a first SLC program mode or a second SLC program mode. This determination may be based on the value of the SLC program mode parameter 810. In one embodiment, when the option is disabled the first SLC program mode that is performed is a relatively slower program operation due to longer time durations during particular sub-clocks in the set of sub-clocks. However, when the option is enabled the second SLC program mode that is performed is a relatively faster program operation due to shorter time durations during the particular sub-clocks in the set of sub-clocks.

Step 706 is performed responsive to a determination that the option is disabled. Step 706 includes selecting a first set of time durations that are shared with an MLC program mode. As noted, this may be a relatively slower SLC program operation due to longer sub-clocks.

Step 708 includes programming a set of memory cells to a single bit per cell using the first set of time durations for the particular sub-clocks in the set of sub-clocks.

710 is performed responsive to a determination that the option is enabled. Step 710 includes selecting a second set of time durations that contain shorter time durations than the corresponding time durations of the first set of time durations. As noted, this may be a relatively fast SLC program operation due to shorter sub-clocks. In an embodiment, the trim parameters for the MLC program mode have several options for the time duration for each sub-clock in the set of sub-clocks. The time durations in the second set may be the shortest time duration of the several options.

Step 712 includes programming a set of memory cells to a single bit per cell using the second set of time durations for the particular sub-clocks in the set of sub-clocks. The memory cells that are programmed in step 712 could be the same set or a different set of memory cells that were programmed in step 708.

Figure 9:
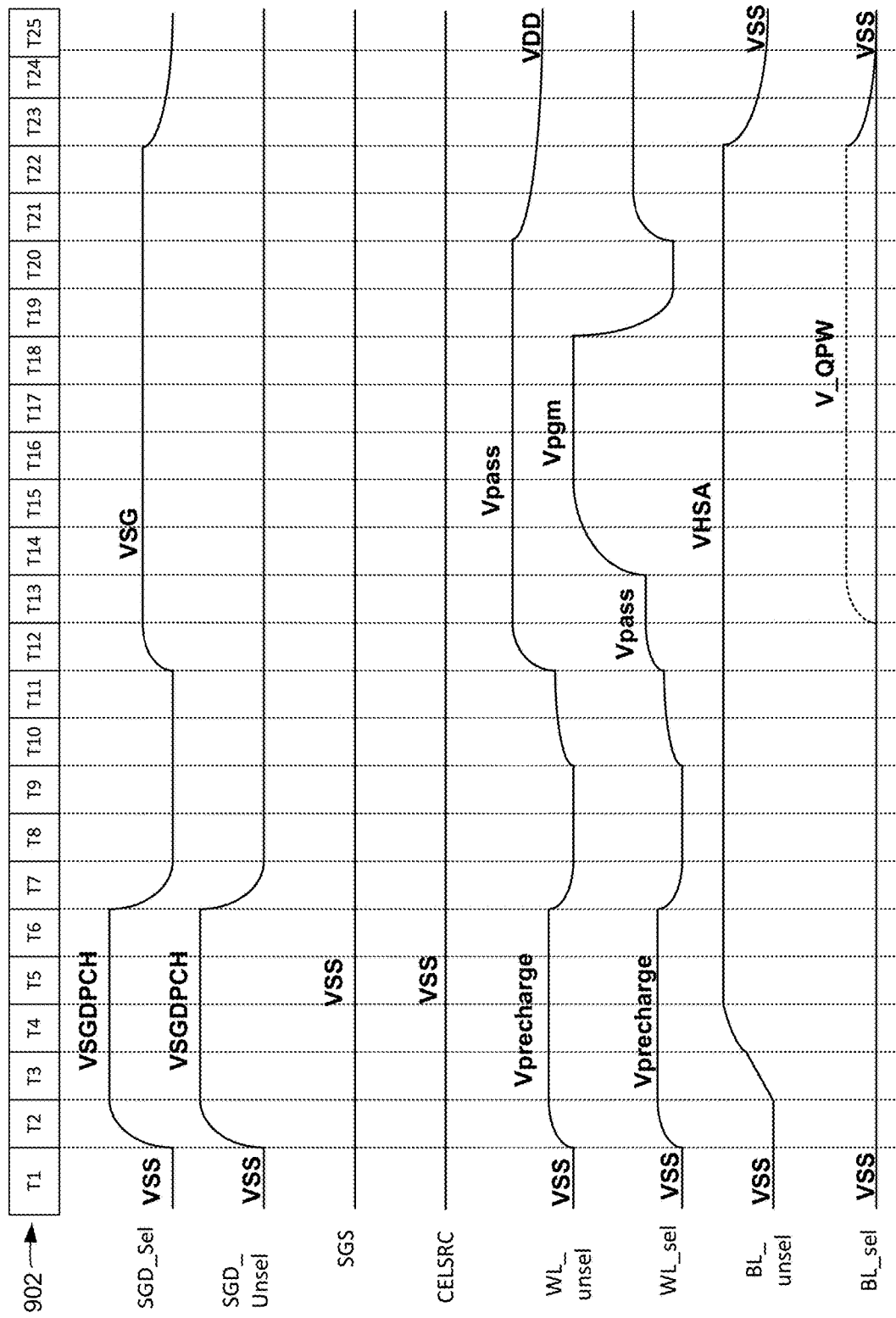
FIG. 9 depicts timing of voltages applied to various control lines in memory structure during program operations.

FIG. 9 depicts timing of voltages applied to various control lines in memory structure 202 during a program operation. The program operation could be SLC or MLC. The program operation is divided into a number of sub-clocks 902 (T1-T25). These are examples of sub-clocks, but the program operation can be divided into different sub-clocks than depicted in FIG. 9. The sub-clocks in FIG. 9 correspond to a program phase and do not include the verify phase. The control lines are for a NAND example. However, other types of memory cells can be programmed in other embodiments. The control line SGD_Sel refers to the selected SGD line, which could be one of SGD-s0, SGD-s1, SGD-s2, SGD-s3, or SGD-s4 in the example of FIG. 4E. The control line SGD_Unsel refers to the unselected SGD lines, which could be the other four of SGD-s0, SGD-s1, SGD-s2, SGD-s3, and/or SGD-s4 in the example of FIG. 4E. The control line SGS refers the source side select line such as SGS in FIG. 4E. The control line CELSRC refers to the source line such as SL in FIG. 4E. The control line WL_sel refers to the word line connected to the memory cells selected for programming (e.g., the selected WL) and could be any of, for example, WL0-WL111 in FIG. 4E. The control line WL_unsel refers to the unselected word lines, which may include all data word lines other than the selected word line. The control line BL_sel refers to the bit lines that are associated with NAND strings having a memory cell that is to receive programming at this time. The control line BL_unsel refers to the bit lines that are associated with NAND strings having a memory cell that is to be inhibited from programming at this time.

During sub-clock T1 all control lines are at a steady state voltage (e.g., VS S or about 0V). The time duration of sub-clock T1 may be used to allow a block select voltage to settle. In one embodiment, the time duration of T1 has a first value (longer) for both an MLC program mode and a slower SLC program mode, but has a second value (shorter) for a faster SLC program mode.

During T2 the voltages on the selected and unselected SGDs are raised to VSGDPCH (a pre-charge channel voltage). During T2 the voltages on the selected and unselected WLs are raised to Vprecharge. During T3 and T4 the voltage on the unselected bit lines is raised to VHSA. The voltage on the unselected bit lines is held at VHSA until the end of T22. VHSA is a voltage that inhibits programming of memory cells. VHSA could be about 2.2V. During T4, T5 and T6 the voltages on the SGDs and WLs are held at VSGDPCH and Vprecharge, respectively. In an embodiment, these voltages are used to pre-charge the NAND channels. During T7 the voltages on the SGDs and WLs are brought back down to VSS. Between T8 and T9 the voltage are held steady. The time duration of sub-clock T9 may be used as a CELSRC set up time for a source side pre-charge. In one embodiment, the time duration of T9 has a first value (longer) for both an MLC program mode and a slower SLC program mode, but has a second value (shorter) for a faster SLC program mode.

During T10 and T11 the voltage on the selected and unselected WLs are raised partway to a boosting voltage (Vpass). During sub-clock T12 the voltage on the selected and unselected WLs are raised the rest of the way to the boosting voltage (Vpass). Also during T12 the voltage on the selected SGD is raised to a select voltage VSG. In one embodiment, the time duration of T12 has a first value (longer) for both an MLC program mode and a slower SLC program mode, but has a second value (shorter) for a faster SLC program mode. Significantly, the sub-clock T12 controls the amount of time for the voltage to ramp up to Vpass on the unselected word lines. The voltage on the unselected word line is held at Vpass until the start of T21. This boosting voltage Vpass on the unselected word line will couple up the NAND channel voltage (of unselected NAND strings) to inhibit programing of memory cells that are connected to the selected word line but are not to receive programming at this time.

Note that the voltage on some of the selected bit lines stays at a program enable voltage (e.g., VSS or 0V) throughout all of the sub-clocks. The program enable voltage will enable programming of a memory cell connected to the selected word line. Memory cells that are close to their target Vt may receive a smaller programming effect by applying a "quick pass write" voltage (V_QPW) to their respective bit lines. The "quick pass write" voltage (V_QPW) may have a magnitude between the program enable voltage (e.g., VSS or 0V) and the program inhibit voltage (VHSA or about 2.2V). During sub-clock T13 the voltage on some of the selected bit lines is raised to V_QPW. In one embodiment, the time duration of sub-clock T13 has a first value (longer) for both an MLC program mode and a slower SLC program mode, but has a second value (shorter) for a faster SLC program mode.

During T14 the voltage on the selected WL is raised at least part way to a program voltage (Vpgm). The voltage may continue to raise to Vpgm during T15. In one embodiment, the time duration of sub-clock T14 has a first value (longer) for both an MLC program mode and a slower SLC program mode, but has a second value (shorter) for a faster SLC program mode. The voltage on the selected WL is held at Vpgm until the end of T18. During T19 the voltage on the selected word line is lowered towards Vss, but does not necessarily reach Vss.

During T21 the voltage on the unselected word lines is lower from Vpass towards Vdd. The voltage may continue to settle to Vdd in later sub-clocks. Also during T21 the voltage on the selected word line is raised. In one embodiment, the time duration of sub-clock T21 has a first value (longer) for both an MLC program mode and a slower SLC program mode, but has a second value (shorter) for a faster SLC program mode.

During T23 the voltages on bit lines are allowed to equalize towards Vss. This equalization of the voltage on the bit lines may continue into T24 and T25. In one embodiment, the time duration of sub-clock T23 has a first value (longer) for both an MLC program mode and a slower SLC program mode, but has a second value (shorter) for a faster SLC program mode.

FIGS. 10A-10D are example tables 1000a, 1000b, 1000c, 1000d of timing parameters for four different sub-clocks of a program operation. These tables may be used for an MLC program mode, a slower SLC program mode and a faster SLC program mode. The MLC program mode could be two-bits per cell, three-bits per cell, four-bits per cell, etc. Table 1000a in FIG. 10A is for sub_clock_A. Table 1000b in FIG. 10B is for sub_clock_B. Table 1000c in FIG. 10C is for sub_clock_C. Table 1000d in FIG. 10D is for sub_clock_D. Tables 1000a, 1000b, 1000c, 1000d are for four different of the sub-clocks in a program operation. These four sub-clocks are examples for a set of sub-clocks associated with the SLC mode parameter. The set of sub-clocks associated with the SLC mode parameter may include more or fewer than four sub-clocks. Also, it is not required that all of the sub-clocks of the program operation are associated with the SLC mode parameter. As one example with reference to FIG. 9 the following sub-clocks could be associated with the SLC mode parameter: T1, T9, T12, T13, T14, T21, T23. In the foregoing example, there may be a separate table 1000 for each of these seven sub-clocks. However, not all of these sub-clocks are required to be associated with the SLC mode parameter. Also, other sub-clocks could be associated with the SLC mode parameter.

Table 1000a in FIG. 10A has eight different possible time durations TD1a, TD2a, TD3a, TD4a, TD5a, TD6a, TD7a, and TD8a for sub-clock_A. In one embodiment, TD1a is the shortest time duration with the durations getting progressively longer up to the longest time duration of TD8a. A multi-bit digital code (DAC) is used to specify which time duration should be used for the sub-clock. Table 1000b has eight different possible time durations TD1b, TD2b, TD3b, TD4b, TD5b, TD6b, TD7b, and TD8b for sub-clock_B. More or fewer than three bits may be used for the DAC to allow for a different number of possible time durations for a particular sub-clock. Table 1000c has sixteen different possible time durations TD1c, TD2c, TD3c, TD4c, TD5c, TD6c, TD7c, TD8c, TD9c, TD10c, TD11c, TD12c, TD13c, TD14c, TD15c, and TD16c for sub-clock_C. Table 1000d has sixteen different possible time durations TD1d, TD2d, TD3d, TD4d, TD5d, TD6d, TD7d, TD8d TD9d, TD10d, TD11d, TD12d, TD13d, TD14d, TD15d, and TD16d for sub-clock_D. In an embodiment, the value of the DAC that is used for an MLC program mode is not required to be the same for each table 1000. In an embodiment, the value of the DAC that is used for a first (slower) SLC program mode is the same DAC that is used for the MLC program mode for each respective table 1000. In an embodiment, a default value for the DAC that is used for a second (faster) SLC program mode is the same value for each table 1000. As one example, the DAC could be '000' for tables 1000a and 1000b and '0000' for tables 1000c and 1000d. In an embodiment, the value of the DAC that is used for a second (faster) SLC program mode corresponds to the shortest time duration in each respective table. In one embodiment, TD1 in each table (e.g., TD1*a*, TD1*b*, TD1*c*, TD1*d*) has the longest time duration and TD8 (e.g., TD8*a*, TD8*b*) or TD16 (e.g., TD16*c*, TD16*d*) has the shortest time duration and, therefore, either '111' or '1111' is used for the DAC value in the fast SLC program mode. Note that the default value of the DAC for the faster SLC program mode is not required to be either the lowest or highest value of the DAC. The term "table" is used throughout this disclosure in a broad manner and may include any type of data structure that organizes information. The tables in FIGS. 10A-10D are organized to associate a different time duration with each different value of a DAC.

FIG. 11 is a flowchart of one embodiment of a process 1100 of programming memory cells in which timing parameters for MLC programming may be shared with SLC programming, while allowing for a faster SLC program mode. The process 1100 will be described with respect to the example tables 1000*a*, 1000*b*, 1000*c*, 1000*d* in FIGS. 10A-10D.

Step 1102 includes a branch depending on whether the program operation is an MLC program mode or an SLC program mode. Step 1104 is performed for the MLC program mode. In step 1104 an MLC DAC is used to select a time duration from a table for each sub-clock in a set of sub-clocks. Note that this set of sub-clocks is the set associated with the SLC mode parameter. For example, a value for the DAC is used to select one of TD1*a* to TD8*a* from table 1000*a*. Also, a value for the DAC is used to select one of T1*b* to T8*b* from table 1000*b*. In a similar manner, a value for the DAC may be used to select an entry from tables 1000*c* and 1000*d* for other sub-clocks of the program operation. In an embodiment, the DAC may have a different value for the different tables 1000. A group of memory cells in the memory structure 202 are then programmed to multiple bits per cell using the selected timing parameters. Referring back to FIG. 9, the timing parameters may be used to control the time durations of a set of the sub-clocks. However, note that not all of the sub-clocks may be of particular interest in process 1100. For example, the set of sub-clocks may be chosen to allow for more aggressive timing parameters in order to provide for a faster SLC program mode.

Step 1106 is performed for an SLC program mode. Step 1106 includes accessing an SLC program mode parameter. Step 1106 may be similar to step 702 in FIG. 7. Step 1108 includes a determination of whether a slower SLC program mode or a faster SLC program mode is to be performed. If the SLC program mode parameter indicates a slower SLC program mode is to be performed then step 1110 is performed. Step 1110 includes using the MLC DAC(s) to select a time duration from the table for each of the sub-clocks in the set of sub-clocks. Step 1110 may be similar to step 1104. Therefore, the same time durations may be selected for each sub-clock for the slower SLC program mode that were used for the MLC program mode in step 1104. A group of memory cells in the memory structure 202 are then programmed to a single bit per cell using the selected timing parameters. Referring back to FIG. 9, the timing parameters may be used to control the time durations of a set of the sub-clocks. Note that the set of the sub-clocks being discussed in step 1110 is the same set of sub-clocks discussed in step 1104 for the MLC program mode. Also note that step 1110 may be used in one embodiment of step 706 in FIG. 7.

If the SLC program mode parameter indicates a faster SLC program mode is to be performed then step 1112 is performed. Step 1112 includes using a default value for the DAC to select a time duration from the table for each respective sub-clock in the set of sub-clocks. Note that this set of sub-clocks is not necessarily all of the sub-clocks of the program operation. Moreover, this is the same set of sub-clocks discussed for the MLC mode of step 1104 and the slower SLC mode of step 1110. In an embodiment, the default value for the DAC in step 1112 has the same value for each table. In one embodiment, the default value for the DAC is the minimum value for the DAC. With reference to the table 1000*a* in FIG. 10A the DAC value '000' may be used to select TD1*a*. With reference to the table 1000*b* in FIG. 10B the DAC value '000' may be used to select TD1*b*. With reference to the table 1000*c* in FIG. 10C the DAC value '0000' may be used to select TD1*c*. With reference to the table 1000*d* in FIG. 10D the DAC value '0000' may be used to select TD1*d*. In one embodiment, step 1112 selects the shortest time duration from each of the tables 1000*a*, 1000*b*, 1000*c*, 1000*d*. Depending on the correlation between the DACs and the time durations, it is possible that a different value of DAC corresponds to the shortest time duration in each respective table 1000. Thus, an alternative to using the minimum value for the DAC is to use some other default value for the DAC (such as, for example, the highest value for the DAC). Also, it is not required to select the shortest time duration from each table. For example, a default DAC may be used to select the second shortest time duration from each table. A group of memory cells in the memory structure 202 are then programmed to a single bit per cell using the selected timing parameters. Referring back to FIG. 9, the timing parameters may be used to control the time durations of the various sub-clocks. Also note that step 1112 may be used in one embodiment of step 710 in FIG. 7.

In view of the foregoing, a first embodiment includes an apparatus comprising apparatus comprising a memory structure comprising non-volatile memory cells and a control circuit in communication with the memory structure. The control circuit is configured to access a single-bit per cell (SLC) program mode parameter that specifies whether to operate in a first SLC program mode or to operate in a second SLC program mode. The control circuit is configured to program a first set of the memory cells to a single bit per cell using a first set of sub-clock durations that are shared with a multi-bit per cell (MLC) program mode in response to the mode parameter specifying the first SLC program mode. The first set of sub-clock durations includes a first time duration for each particular sub-clock in a set of the sub-clocks. The control circuit is configured to program a second set of the memory cells to a single bit per cell using a second set of sub-clock durations in response to the mode parameter specifying the second SLC program mode. The second set of sub-clock durations includes a second time duration for each particular sub-clock in the set of the sub-clocks. The second time duration is shorter than the first time duration for each particular sub-clock in the set of the sub-clocks.

In a second embodiment, in furtherance to the first embodiment, the control circuit is further configured to program a third set of the memory cells to multiple bits per cell using the first set of sub-clock durations for the respective sub-clocks in the set of sub-clocks.

In a third embodiment, in furtherance to the first or second embodiments, the apparatus further comprises non-transitory memory that stores trim parameters. For each particular sub-clock of the set of sub-clocks the trim parameters include a plurality of time durations. The second time duration for each particular sub-clock in the set of the sub-clocks is a shortest time duration of the plurality of time durations for the particular sub-clock.

In a fourth embodiment, in furtherance to any of the first to third embodiments, the apparatus further comprises non-transitory memory that stores trim parameters. The trim parameters include a table for each particular sub-clock in the set of sub-clocks. The table for each particular sub-clock comprises a plurality of entries that are specified by different values of a multi-bit digital code. Each entry specifies a time duration for the particular sub-clock. The control circuit is configured to use the same value for the multi-bit digital code for both the first SLC program mode and the MLC program mode for the table for each particular sub-clock in the set of sub-clocks. The control circuit is configured to use a default value for the multi-bit digital code for the second SLC program mode for the table for each particular sub-clock in the set of sub-clocks.

In a fifth embodiment, in furtherance the fourth embodiment, the default value for the multi-bit digital code corresponds to a shortest time duration from the trim parameters for each particular sub-clock in the set of sub-clocks.

In a sixth embodiment, in furtherance the any of the first to fifth embodiments, the control circuits is further configured to program the second set of memory cells with a single program pulse without verification in the second SLC program mode.

In a seventh embodiment, in furtherance the any of the first to sixth embodiments, the SLC program mode parameter is a factory setting that the control circuit accesses from non-volatile storage in the memory structure.

In an eighth embodiment, in furtherance to any of the first to seventh embodiments, the SLC program mode parameter is provided to the control circuit from a memory controller. The control circuit is configured to dynamically switch between the first SLC program mode and second SLC program mode in response to receiving a change in a value of the SLC program mode parameter.

In a ninth embodiment, in furtherance to any of the first to eighth embodiments, the SLC program mode parameter comprises a single bit.

One embodiment includes a method for programming non-volatile memory, the method comprises programming memory cells in a multi-bit per cell (MLC) program mode that uses a first set of timing parameters for a set of sub-clocks. Each respective sub-clock in the first set of timing parameters has a time duration. The method comprises programming memory cells in a first single-bit per cell (SLC) program mode that uses the first set of timing parameters for the set of sub-clocks. The method comprises programming memory cells in a second SLC program mode that uses a second set of timing parameters for the set of sub-clocks. A time duration of each respective sub-clock in the second set of timing parameters is shorter than the time duration of each corresponding sub-clock in the first set of timing parameters.

One embodiment includes a non-volatile storage system comprising a memory structure comprising non-volatile memory cells, non-transitory memory that stores trim parameters, and one or more control circuits in communication with the non-transitory memory and the memory structure. For each particular sub-clock of a set of sub-clocks of a program operation the trim parameters include a plurality of time durations for the particular sub-clock. The plurality of time durations for each particular sub-clock are specified by a multi-bit digital code. The one or more control circuits are configured to program memory cells in a multi-bit per cell (MLC) program mode in which the time duration for each particular sub-clock in the set of sub-clocks is selected based on a value of a multi-bit digital code for the particular sub-clock. The one or more control circuits are configured to program memory cells in a single-bit per cell (SLC) program mode in which the time duration for each particular sub-clock in the set of sub-clocks is selected based on a default value of the multi-bit digital code. The default value of the multi-bit digital code corresponds to a shorter time duration for each particular sub-clock in the set of sub-clocks than the time duration selected based on the value of the multi-bit digital code for the particular sub-clock.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:
1. An apparatus comprising:
   a memory structure comprising non-volatile memory cells; and
   a control circuit in communication with the memory structure, wherein the control circuit is configured to:
      access a single-bit per cell (SLC) program mode parameter that specifies whether to operate in a first SLC program mode or to operate in a second SLC program mode;
      program a first set of the memory cells to a single bit per cell using a first set of sub-clock durations that are shared with a multi-bit per cell (MLC) program mode in response to the mode parameter specifying the first SLC program mode, wherein the first set of sub-clock durations includes a first time duration for each particular sub-clock in a set of the sub-clocks; and program a second set of the memory cells to a single bit per cell using a second set of sub-clock durations in response to the mode parameter specifying the second SLC program mode, wherein the second set of sub-clock durations includes a second time duration for each particular sub-clock in the set of the sub-clocks, wherein the second time duration is shorter than the first time duration for each particular sub-clock in the set of the sub-clocks.

2. The apparatus of claim 1, wherein the control circuit is further configured to:
program a third set of the memory cells to multiple bits per cell using the first set of sub-clock durations for the respective sub-clocks in the set of sub-clocks.

3. The apparatus of claim 1, further comprising:
non-transitory memory that stores trim parameters, wherein for each particular sub-clock of the set of sub-clocks the trim parameters include a plurality of time durations, wherein the second time duration for each particular sub-clock in the set of the sub-clocks is a shortest time duration of the plurality of time durations for the particular sub-clock.

4. The apparatus of claim 1, further comprising non-transitory memory that stores trim parameters, the trim parameters include a table for each particular sub-clock in the set of sub-clocks, the table for each particular sub-clock comprises a plurality of entries that are specified by different values of a multi-bit digital code, wherein each entry specifies a time duration for the particular sub-clock, and wherein the control circuit is configured to:
use the same value for the multi-bit digital code for both the first SLC program mode and the MLC program mode for the table for each particular sub-clock in the set of sub-clocks; and
use a default value for the multi-bit digital code for the second SLC program mode for the table for each particular sub-clock in the set of sub-clocks.

5. The apparatus of claim 4, wherein the default value for the multi-bit digital code corresponds to a shortest time duration from the trim parameters for each particular sub-clock in the set of sub-clocks.

6. The apparatus of claim 1, wherein the control circuit is further configured to:
program the second set of memory cells with a single program pulse without verification in the second SLC program mode.

7. The apparatus of claim 1, wherein the SLC program mode parameter is a factory setting that the control circuit accesses from non-volatile storage in the memory structure.

8. The apparatus of claim 1, wherein:
the SLC program mode parameter is provided to the control circuit from a memory controller; and
the control circuit is configured to dynamically switch between the first SLC program mode and second SLC program mode in response to receiving a change in a value of the SLC program mode parameter.

9. The apparatus of claim 1, wherein the SLC program mode parameter comprises a single bit.

10. A method for programming non-volatile memory, the method comprising:
programming memory cells in a multi-bit per cell (MLC) program mode that uses a first set of timing parameters for a set of sub-clocks, wherein each respective sub-clock in the first set of timing parameters has a time duration;
programming memory cells in a first single-bit per cell (SLC) program mode that uses the first set of timing parameters for the set of sub-clocks; and
programming memory cells in a second SLC program mode that uses a second set of timing parameters for the set of sub-clocks, wherein a time duration of each respective sub-clock in the second set of timing parameters is shorter than the time duration of each corresponding sub-clock in the first set of timing parameters.

11. The method of claim 10, further comprising:
selecting the first set of timing parameters from a respective table for each sub-clock in the set based on a multi-bit digital code, wherein the respective table for each sub-clock is stored in non-transitory memory; and
selecting the second set of timing parameters from the respective table for each sub-clock in the set based on a default value of the multi-bit digital code.

12. The method of claim 11, wherein the default value of the multi-bit digital code corresponds to a shortest time duration in each respective table.

13. The method of claim 10, further comprising:
accessing a mode parameter that indicates whether to operate in the first SLC program mode or the second SLC program mode;
selecting the first set of timing parameters for the set of sub-clocks responsive to the mode parameter indicating the first SLC program mode; and
selecting the second set of timing parameters for the set of sub-clocks responsive to the mode parameter indicating the second SLC program mode.

14. A non-volatile storage system comprising:
a memory structure comprising non-volatile memory cells;
non-transitory memory that stores trim parameters, wherein for each particular sub-clock of a set of sub-clocks of a program operation the trim parameters include a plurality of time durations for the particular sub-clock, wherein the plurality of time durations for each particular sub-clock are specified by a multi-bit digital code; and
one or more control circuits in communication with the non-transitory memory and the memory structure, wherein the one or more control circuits are configured to:
program memory cells in a multi-bit per cell (MLC) program mode in which the time duration for each particular sub-clock in the set of sub-clocks is selected based on a value of a multi-bit digital code for the particular sub-clock; and
program memory cells in a single-bit per cell (SLC) program mode in which the time duration for each particular sub-clock in the set of sub-clocks is selected based on a default value of the multi-bit digital code, wherein the default value of the multi-bit digital code corresponds to a shorter time duration for each particular sub-clock in the set of sub-clocks than the time duration selected based on the value of the multi-bit digital code for the particular sub-clock.

15. The non-volatile storage system of claim 14, wherein the default value of the multi-bit digital code corresponds to a minimum time duration for each particular sub-clock in the set of sub-clocks.

16. The non-volatile storage system of claim 14, wherein the one or more control circuits are further configured to:

access a mode parameter having a value that specifies whether to operate in a first SLC program mode or to operate in a second SLC program mode; and select the time duration for each particular sub-clock in the set of sub-clocks based on the same multi-bit digital code that is used for the MLC program mode in response to the mode parameter specifying the first SLC program mode, wherein the same time durations are used for the MLC program mode and the first SLC program mode for each particular sub-clock in the set of sub-clocks.

17. The non-volatile storage system of claim 16, wherein the one or more control circuits are further configured to:

select the time duration for each particular sub-clock in the set of sub-clocks based on the default value of the multi-bit digital code in response to the mode parameter specifying the second SLC program mode, wherein shorter time durations are used for the second SLC program mode for each respective sub-clock in the set of sub-clocks relative to the first SLC program mode.

18. The non-volatile storage system of claim 16, wherein the one or more control circuits are further configured to:

access the mode parameter from the non-transitory memory that stores the trim parameters.

19. The non-volatile storage system of claim 16, wherein the one or more control circuits are further configured to:

access the mode parameter from a memory controller; and dynamically switch between the first SLC program mode and second SLC program mode in response to receiving a change in the value of the mode parameter from the memory controller.

20. The non-volatile storage system of claim 14, wherein the one or more control circuits are further configured to:

program the memory cells with a single program pulse without verification in the SLC program mode in which the time duration for each particular sub-clock in the set of sub-clocks is selected based on the default value of the multi-bit digital code.

* * * * *